United States Patent [19]
Busse et al.

[11] Patent Number: 5,999,412
[45] Date of Patent: Dec. 7, 1999

[54] PRINTED-CIRCUIT BOARD AND METHOD FOR THE PRECISE ASSEMBLY AND SOLDERING OF ELECTRONIC COMPONENTS ON THE SURFACE OF THE PRINTED-CIRCUIT BOARD

[75] Inventors: Ralf-Dieter Busse; Carsten Storbeck; Thomas Lade, all of Berlin, Germany

[73] Assignee: Krone Aktiengesellschaft, Berlin-Zehlendarf, Germany

[21] Appl. No.: 08/815,114

[22] Filed: Mar. 11, 1997

[30] Foreign Application Priority Data

| Mar. 18, 1996 | [DE] | Germany | 196 10 586 |
| Mar. 25, 1996 | [DE] | Germany | 196 11 631 |
| May 21, 1996 | [DE] | Germany | 196 20 340 |

[51] Int. Cl.$^6$ ............... H05K 1/18; H05K 7/02
[52] U.S. Cl. ............................................. 361/761
[58] Field of Search ................ 29/832, 837, 840, 29/846, 852; 174/260, 261; 228/180.21, 180.22, 179.1, 180.1; 257/700, 678, 723, 724, 774, 797; 361/118, 119, 100, 42, 761–764, 820; 438/121, 122, 125, 401, 456; 439/68, 82, 83

[56] References Cited

U.S. PATENT DOCUMENTS

| 2,777,039 | 1/1957 | Thias | 361/761 |
| 2,869,041 | 1/1959 | Cola | 361/761 |
| 2,990,498 | 6/1961 | Evans | 361/761 |
| 3,049,647 | 8/1962 | Lincoln | 361/761 |
| 3,142,783 | 7/1964 | Warren | 361/764 |
| 3,349,480 | 10/1967 | Rashleigh | 361/764 |
| 4,542,439 | 9/1985 | Dick | 361/761 |
| 5,055,637 | 10/1991 | Hagner | 361/761 |
| 5,420,755 | 5/1995 | Hiller . | |
| 5,579,212 | 11/1996 | Albano et al. | 361/820 |
| 5,600,175 | 2/1997 | Orthmann | 361/820 |

FOREIGN PATENT DOCUMENTS

| 0 111 222 | 6/1984 | European Pat. Off. . |
| 1 071 170 | 12/1959 | Germany . |
| 1 844 657 | 1/1962 | Germany . |
| 40 26 004 C2 | 2/1963 | Germany . |
| 19 42 135 | 7/1966 | Germany . |
| 2 032 994 | 1/1972 | Germany . |

(List continued on next page.)

*Primary Examiner*—Donald Sparks
*Attorney, Agent, or Firm*—McGlew and Tuttle, P.C.

[57] ABSTRACT

A printed-circuit board and a method for the precise assembly of electronic components on a surface of the printed-circuit board, the electronic components being electrically and conductively attached to printed-circuit board by a reflow soldering technique. For this purpose, a printed-circuit board is used that has sections for receiving electronic components on its surface. The sections being at least partially adapted to the outside contour of respective electronic components. The sections are configured as slotted contours or grooves and shaped to secure that the electronic components mounted after the application of solder paste are held in their desired positions prior to the actual soldering process. In addition, the assembled printed-circuit board can be connected to a housing composed of dome-type extensions of an at least partly deformable material. The extensions engage in cutouts provided in the printed-circuit board and pass through the latter. A positive-linkage and/or frictional housing/printed-circuit board connection is established by deformation of the extensions. Further, an overvoltage protection plug for terminal blocks of the telecommunication technique with a voltage surge arrester can be mounted that combines the two functions "earthing contact" and "fail-safe contact" in one part.

12 Claims, 6 Drawing Sheets

FOREIGN PATENT DOCUMENTS

| | | |
|---|---|---|
| 86 000878 | 4/1986 | Germany . |
| 35 01 710 | 7/1986 | Germany . |
| 27 13 650 C2 | 10/1986 | Germany . |
| 33 23 687 C2 | 12/1986 | Germany . |
| 90 12 638 | 12/1990 | Germany . |
| 90 12 951 U1 | 1/1991 | Germany . |
| 92 01 118 | 4/1992 | Germany . |
| 0540 497 A2 | 10/1992 | Germany . |
| 42 15 041 A1 | 11/1992 | Germany . |
| 41 26 913 A1 | 2/1993 | Germany . |
| 42 25 484 C1 | 12/1993 | Germany . |
| 40 16 366 C2 | 4/1994 | Germany . |
| 44 03 053 C1 | 3/1995 | Germany . |
| 44 37 122 A1 | 4/1996 | Germany . |
| 296 11 468 U1 | 10/1996 | Germany . |
| 2-009193 | 3/1990 | Japan . |
| 2-224293 | 11/1990 | Japan . |
| 4-163987 | 9/1992 | Japan . |
| 820 824 | 9/1959 | United Kingdom . |
| 2 204 184 | 11/1988 | United Kingdom . |
| WO 90/04912 | 5/1990 | WIPO . |
| WO 90 13990 | 11/1990 | WIPO . |
| WO 95/03683 | 2/1995 | WIPO . |

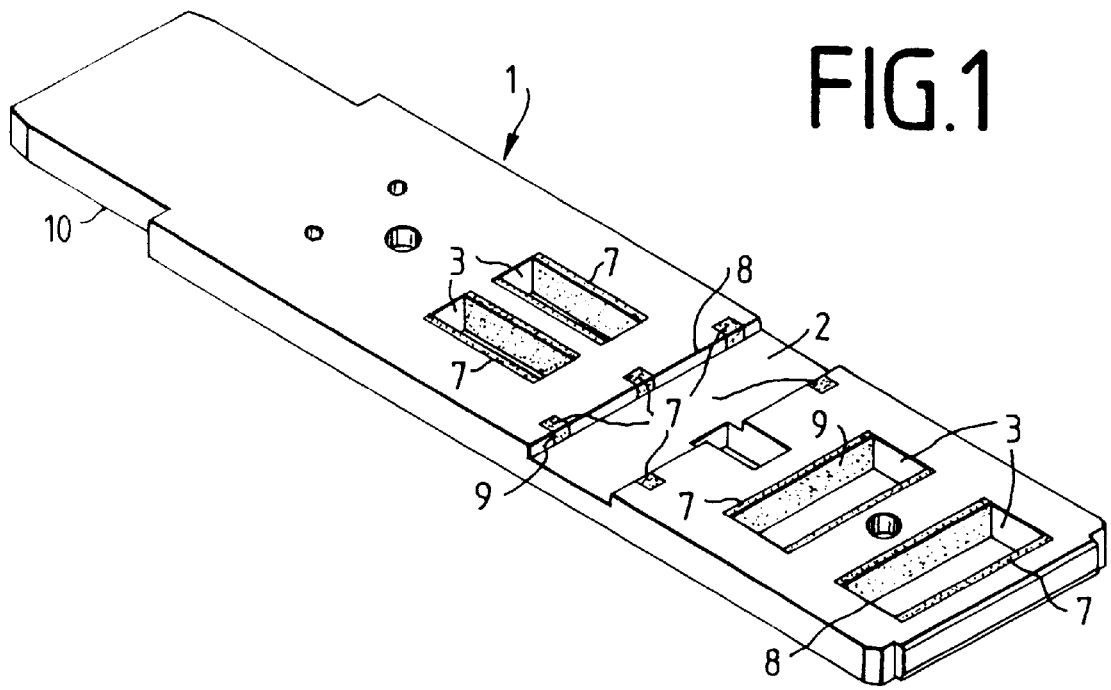
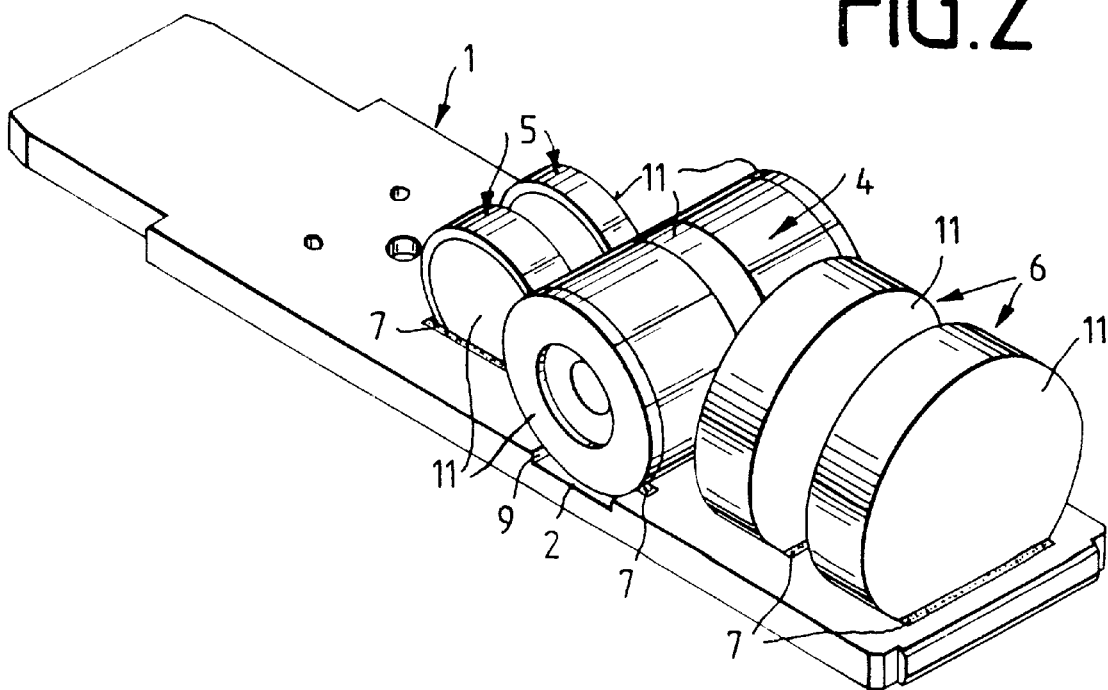

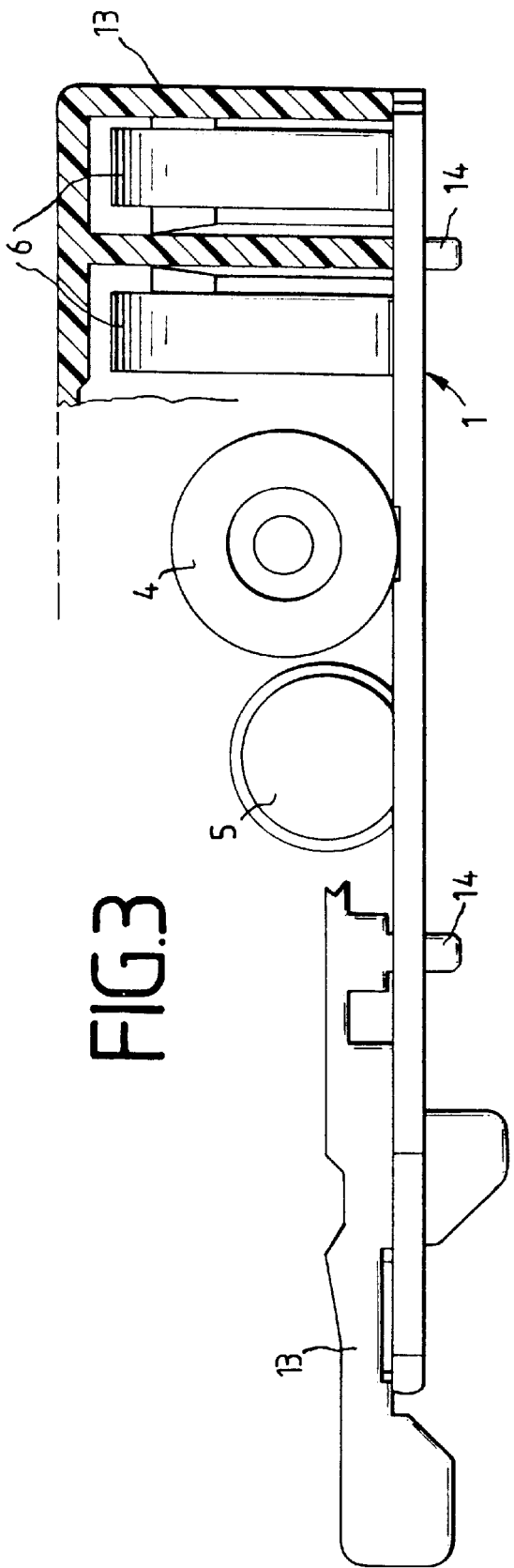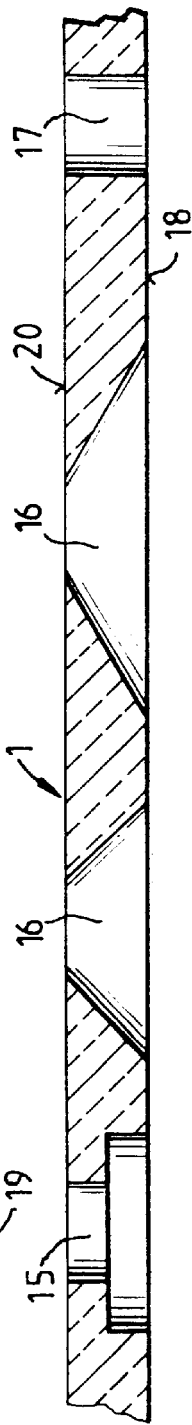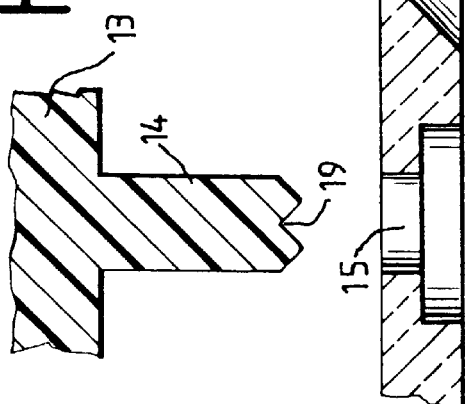

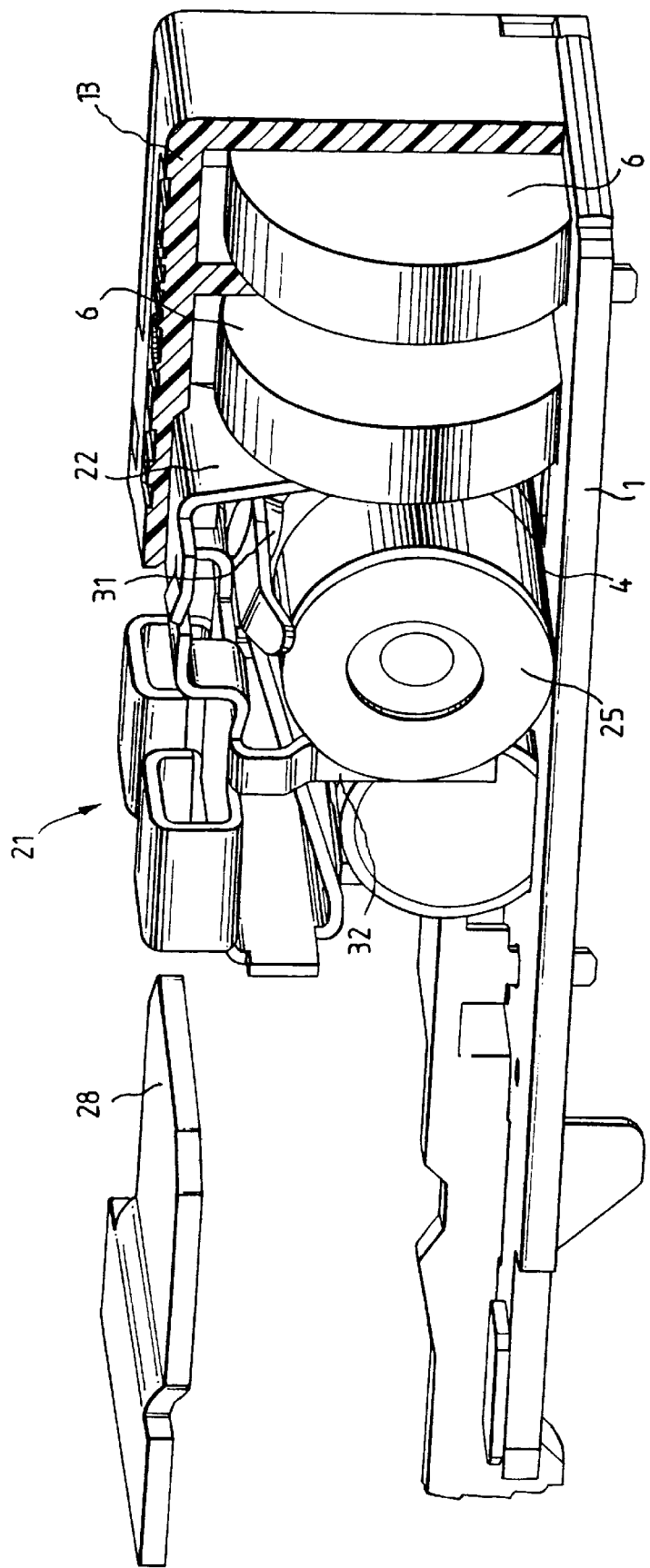

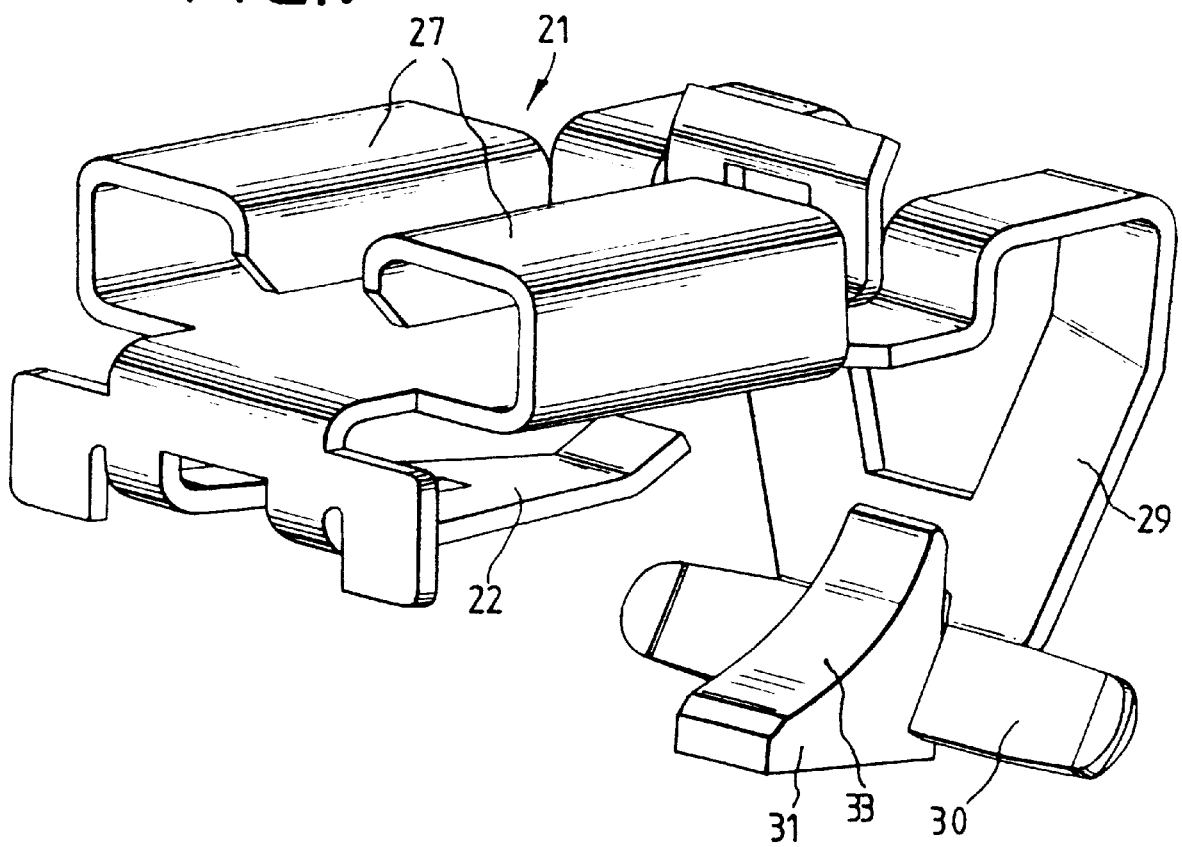

PRINTED-CIRCUIT BOARD AND METHOD FOR THE PRECISE ASSEMBLY AND SOLDERING OF ELECTRONIC COMPONENTS ON THE SURFACE OF THE PRINTED-CIRCUIT BOARD

FIELD OF THE INVENTION

The invention relates to a printed-circuit board and a method for the precise assembly of electronic components on the surface of the printed-circuit board, the electronic components being electrically and conductively attached to the printed-circuit board by means of a reflow soldering technique. In particular, the printed-circuit board configured according to the invention is intended for use in voltage surge protection assemblies, where the electronic components are voltage surge arresters, PTC's, varistors and diodes.

BACKGROUND OF THE INVENTION

It is known to mount the voltage surge arresters by a reflow soldering technique on the printed-circuit board and to contact the other electronic components, such as PTC'S, varistors and diodes as chip components by means of a conventional clamping technique. Therein problems exist with the precise positioning of the voltage surge arrester, when the latter is not held in the desired position during the soldering process, and therefore contact problems or difficulties during further processing or assembly of the printed-circuit board may occur.

By various techniques of assembling different components on the printed-circuit board, several steps are required for contacting. Further, additional contact lugs are required for the assembly of the printed-circuit board with the other components (PTC's and varistors), thus increasing the material and manufacture costs.

In reflow soldering techniques it is common to apply solder material on the printed-circuit boards at positions intended for receiving an electronic component. Thereafter, the respective component is mounted on the solder material still being in a pasty condition, and then the completely assembled printed-circuit board is heated, until the solder material melts, and after cooling down, the electronic component is held in position by the re-solidified solder material and is electrically contacted.

As long as the solder material does not yet effect an intense connection of the electronic component to the printed-circuit board, that is immediately after placing the electronic components, the respective electronic component may slip and come out of the desired position. Since the reflow soldering technique is usually performed in continuous-heating furnaces, such as they are for example known from DE 40 16 366 C2, provisions have to be taken during transportation of the preassembled printed-circuit board, such provisions preventing the electronic component from slipping away from the desired position by movements or vibrations.

In order to prevent such slipping away, there is known for example from EP 0 540 497 A2 the utilization of a matrix which can however only determine the surface shape of the solder applied to the solder positions. Fixation of the component at least to a certain degree is not possible by this method. Positioning is to be facilitated by that the generated solder positions have a plane surface.

The utilization of an adhesive to fix the components to an printed-circuit board is disclosed in DE 41 26 913 A1. Therein the connection of the respective component to the printed-circuit board is established by an adhesive. Thereafter the actual soldering process is performed, and the complete connection is finally accomplished. In addition to the required adhesive, the supply of which necessitates higher expenditures for the printed-circuit board assembly, high requirements have to be met by the use of adhesive. Since the latter is exposed to high temperatures during soldering, it may come to damage the solder due to solvent possibly contained in the adhesive.

SUMMARY AND OBJECTS OF THE INVENTION

The object of the present invention is to provide a printed-circuit board and a method for the assembly of such a printed-circuit board, wherein in a simple manner the electronic components to be applied to the surface of the printed-circuit board can precisely be positioned and thereafter be soldered in this position.

According to the invention, this object is achieved for the printed-circuit board configured according to the invention using a board material defining depression sections for receiving the electrical components. The depressions being shaped to conform to outside contours of the electrical components and securely hold said electrical components during a reflow solder operation. The method for the assembly of such a printed-circuit board is by forming termination surfaces on the surface of said board, applying solder paste to the termination surfaces, applying the electrical components to the depression sections, and heating the solder paste to a temperature above a melting point of the solder paste.

The depression sections in the surface of a printed-circuit board according to the invention are configured in such a manner that they define recesses adapted at least partially in their contours to the planar outside contours of the respective electronic components to be mounted on the printed-circuit board. Preferably grooves or slotted contours are provided into which the electronic components to be mounted can be fitted. The contours of the grooves or slots are configured such that they can hold the respective electronic components to be mounted in the desired position on the printed-circuit board by their selected shapes.

Further, during automated assembly there are problems when base plates or printed-circuit boards already assembled are to be connected to a housing. When using connection technologies such as gluing, there are high expenditures due to high installation costs caused by the required glue supply and a normally also required suction device for solvent vapors. Also incurred are costs due to the control and monitoring of the joining process, since it is to be avoided that a certain portion of the glue will come to the bottom side of the printed-circuit board or even into the automatic machine or installation.

Connections that seem to be possible by latch lugs or other elements configured in a similar manner have the disadvantage that, on one hand, correspondingly configured elements require complicated shapes for the manufacture thereof, and that, on the other hand, they are subject to interferences due to the small sizes made necessary by the limited space available, since they will easily break under the rough manufacturing conditions and will thus not be operable anymore. Since printed-circuit boards of relatively small thickness are used, it is difficult or even impossible to configure the latch elements such that a projection over or beyond the bottom side of the printed-circuit board can be avoided.

A protection circuit for telecommunication installations for protecting a user from overvoltage and overcurrent is disclosed for example in DE 40 26 004 C2, by means of which a voltage surge arrester can also be protected from thermal overloads after response of a thermal protection element (fail-safe contact). For this purpose, a sheet-metal part is in contact with the voltage surge arrester, and to the sheet-metal part is connected a solder position with a slider against which a spring acts. When the voltage surge arrester heats up in an inadmissible way, and thus also the sheet-metal part, the solder position will melt away, and the slider is moved by the force of the spring and the voltage surge arrester is shorted. A thus configured thermal protection device needs quite a number of individual parts, resulting in high expenditures for production and assembly. Further, the necessary space requirement is relatively high. In particular the use of springs is critical with regard to an automatic assembly, since special requirements therefore exist.

In the solution disclosed in DE 40 26 004 C2 additional elements are required for the establishment of a connection to earth potential.

Further, from DE 33 23 687 C2 is known a voltage surge arrester magazine for terminal blocks of the telecommunication technique, wherein for the thermal protection an S-shaped bracket spring can be inserted from above for each spark gap of a two-way arrester, the bracket spring having a solder element at its one leg and a latch device at its other leg. This thermal protection is also expensive to manufacture and subject to interferences due to the additional bracket spring.

The printed-circuit board according to the invention makes it possible to mount all components commonly in one step and to finally complete the printed-circuit board already assembled by means of a reflow soldering technique, and to establish the fixation of the electronic components and the required electrical connection and to provide it in a simple manner with a housing.

By the depression sections provided on the surface of the printed-circuit board, wherein the electronic components are mounted, it is possible, by the recessed configuration, to reduce the overall height or to prevent, with thicker printed-circuit boards, an increase of the required height. The utilization of printed-circuit boards having a higher overall height is also favorable due to the higher heat resistance during soldering. If for example the printed-circuit boards according to the invention are provided with voltage surge arresters, these will determine the overall required height that cannot be increased or even reduced, as explained above. Terminal blocks or disconnect blocks with two lines of insulation displacement contacts are known in the art. To the insulation displacement contacts are connected cable wires. If the assembled printed-circuit board is used as a protection plug and inserted into a disconnect block, at least the two insulation displacement contacts of the first line are covered by the protection plug. Due to the small height of the protection plug it is secured that the second line of insulation displacement contacts is freely accessible and connectable with mounted protection plug.

Instead of the printed-circuit board, a simpler base plate can be used that can be assembled or also covered with a housing.

There are provided terminals on the surface of the printed-circuit board that can be connected to the electrodes of the voltage surge arrester and to the complete layout of the printed-circuit board.

The electronic components (PTC's, varistors) used can be low-cost components in chip form that have at least one solderable surface, contacting of the respective components on the printed-circuit board. The solderable surface being preferably by a slotted contour or side of the depression section used for a respective element. Positioning of the components during assembly preferably is to be made vertically to the printed-circuit board, the actual solder connection being established over the front faces of the respective components up to the connection surfaces (pads) disposed adjacent to the slotted contour or the groove.

The sections on the printed-circuit board configured to receive the respective components are dimensioned such that the depth of the printed-circuit board can nearly completely be used, and thus a relatively large soldering surface is achieved.

For increasing the wetting capability of the components, the slotted contours or grooves can be at least partially be metallized at their borders. The metallized portion of the sections configured to receive the components are preferably provided at the longitudinal surfaces. Metallization can be performed by a galvanic process, such as known for through-contacts.

Prior to the actual assembly of the printed-circuit board with the electronic components, the solder paste to be used is applied for all components either by means of a template printing or a dispense process. Thereby it can be achieved that only those sections definitely required for the establishment of a connection are provided with solder paste, and therefore in spite of a safe provision of the required connection between printed-circuit board and components, no re-work is necessary.

The printed-circuit board according to the invention and the method according to the invention furthermore have the advantage over the solutions described above, in that the number of required individual parts is reduced and in particular no additional contact surfaces are required.

A foil to be applied to the bottom side of the printed-circuit board covers the printed-circuit board in this direction, and if a suitable foil material is selected, a voltage-resistant embodiment (contact protection) of the complete assembly is possible on this side. Further, by means of a dispense process, an isolator can be applied to the bottom side of the printed-circuit board also allowing a voltage-resistant embodiment. When using a printed-circuit board according to the invention with the sequences also suggested, manufacture can be optimized with regard to costs, since the expenditures can be reduced in particular by the option of automating the process. Another advantage is that the failure rate can be reduced, since the positioning accuracy can be improved by simple measures and faults can therefore be avoided.

The printed-circuit board according to the invention can be covered with a housing and provided with electronic components as a voltage surge protection module. At least two dome-type extensions of an at least partly deformable material are arranged at the housing. The extensions extend at the housing towards the base plate to be connected and engage into cutouts provided therein. The size of the dome-type extension is such that they can be guided without any problems during assembly into the cutouts and are deformed by exposure to energy and/or force such that a positive-linkage and/or frictional connection between housing and base plate is established. The extensions are to be dimensioned, further, that after the deformation achieved by energy and/or force exposure they do not project over the plane given by the bottom side of the base plate and thus guarantee that these modules can be connected in the required way.

The embodiment according to the invention can further be advantageously secured in that the modules are pluggable without problems as protection plugs, with a simultaneous reduction of the required space and without any interferences between adjacent modules or other circuit elements.

Manufacture can advantageously be performed in two steps by an automatic machine, in the first step the housing being placed on or in the base plate, resp., and held there, and in the second step the deformation of the extensions being activated. This can be achieved in an advantageous manner by pressure with heated pins against the front faces of the dome-type extensions. Heating causes a softening of the extensions material, and by the pressure of the pins the desired shape can be produced, thus being secured that base plate and housing are connected to each other free from play.

Heating of the pins can for example be achieved by resistance heating. There is also the possibility, however, to use other forms of energy, such as electromagnetic radiation, in order to make possible a temperature increase and thus softening of the extensions material, which is a suitable plastic material, preferably a thermoplastic material.

With corresponding configuration, an overvoltage protection plug combining the two functions "earthing contact" and "fail-safe contact" in one part can be made by punching and subsequent bending. This configuration has the advantage that the expenses for assembly are considerably reduced and linear joining movements only are to be performed for the insertion into the housing, those movements being particularly favorable for automatic assembly machines.

Another advantage is that the number of transition positions loaded by surge currents can be removed.

The second contact bracket has in the assembled condition a permanent biasing force against the external electrodes disposed at the voltage surge arrester. During normal operation, the thermal element acts against the biasing force of the second contact bracket and insulates the second contact bracket from the external electrodes and prevents an electrically conductive connection between the contact element and the external electrodes of the voltage surge arrester exists. The thermal element can be configured as a solder element attached at the second contact bracket, or can be snap-fitted in a cutout provided in the contact bracket. In this latter solution, the contact element is first positioned without the thermal element in the housing of the protection plug. After connecting the housing to the printed-circuit board of the protection plug, the thermal element is then latched in the second contact bracket, and the fail-safe contact is completely biased and made operable.

The thermal element can be a molded part made from a material, such as metal that melts when heated up and releases the movement of the second contact bracket towards the external electrodes of the voltage surge arrester, so that a conductive connection between the telecommunication wires and the earthing bar exists. The melt temperature of the material is selected such that damages to the installation or even fire risks can be excluded.

The thermal element can also be made of a material that will only become soft when correspondingly heated up, and will yield under the biasing force of the second contact bracket such that the latter will come into contact with the external electrodes and can establish the conductive connection to the electrodes.

Further possibilities are the utilization of bi-metals or known memory alloys that are capable, when heated up, to release the second contact bracket for the connection to the external electrodes of the voltage surge arrester.

Moreover, the thermal element can be composed of an insulating paint or an insulating foil disposed between the external electrodes of the voltage surge arrester and the second contact bracket resiliently resting there-against and insulating them from each other. The paint or the foil will melt when heated up, thus the conductive connection being established.

Preferably the contact element is configured as at least one resilient holding leg serving as a counterbearing on the side of the voltage surge arrester opposite to the first holding bracket at the insulating surface thereof. Thereby an unbalanced load of the solder connection between the voltage surge arrester and the printed-circuit board carrying the latter is prevented.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is a printed-circuit board according to the invention prior to assembly;

FIG. 2 is a printed-circuit board provided with components according to FIG. 1;

FIG. 3 is a printed-circuit board with a housing mounted already, prior to the final connection;

FIG. 4 is a diagrammatical representation of a dome-type extension at the housing;

FIG. 5 shows several embodiments for cutouts to be used in the printed-circuit board;

FIG. 8 is a protection plug for use in telecommunication installations under application of the contact element of FIG. 6; and FIG. 9 is a second example of a contact element.

DETAILED DESCRIPTION OF THE PREFERRED EMBODIMENT

Figure 6:
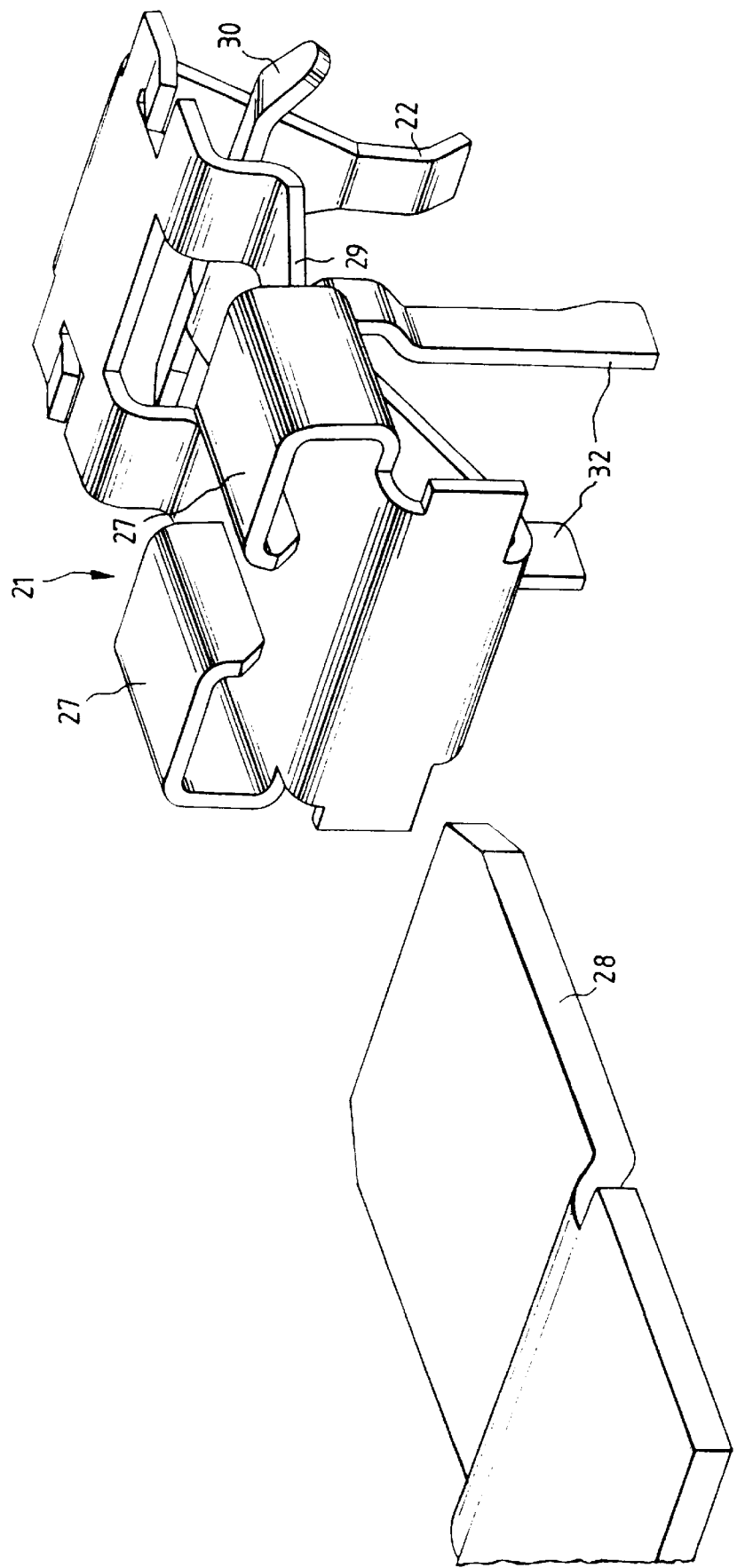
FIG. 6 is an example of a contact element for voltage surge protection plug.

FIG. 1 shows a printed-circuit board 1 configured according to the invention, the printed-circuit board having various depression sections 2, 3 machined in the board material of printed-circuit board 1. A transverse groove 2 is provided on surface 12 of printed-circuit board 1. The transverse groove is intended for receiving a voltage surge arrester not shown in FIG. 1. Printed-circuit board 1 has a thickness of 1.2 mm, which is different from printed-circuit boards of 0.8 mm thickness used up to now. The thickness is such that a groove 2 can be provided in printed-circuit board 1 with sufficient depth. The width of groove 2 should be selected with consideration of its depth and the outside dimensions so that the mounted voltage surge arrester is held by the shape of groove 2 in the desired position, and displacement or slipping-away is prevented even when moved through a continuous-heating furnace.

In addition to groove 2, slotted contours 3 are provided on the surface of printed-circuit board 1, wherein other electronic components, also not shown in FIG. 1, can be accommodated.

The machined sections (groove 2, slotted contours 3) can be provided during the manufacture of the printed-circuit board for example by milling or punching.

The slotted contours are preferably metallized at the inner faces 9 only, the faces being provided with termination surfaces 7, wherein copper can for example be deposited galvanically. After solder paste has been applied by suitable methods at the respective positions in the area of the provided structures, assembly with the various electronic components can be performed in an automated manner and one process step.

Printed-circuit board 1 shown in FIG. 2 is provided with a voltage surge arrester 4 mounted in groove 2 and two varistors 5 and two PTC's 6 mounted in slotted contours 3. It can be seen that components 4, 5 and 6 are selected with regard to their dimensions to match the sections configured as groove 2 or slotted contours 3, such that only the shape of sections 2 and 3 prevents a slipping-away, and electronic components 4, 5 and 6 are precisely held in the desired position. If at least some of the surfaces surrounding sections 2 and 3 are inclined, this will have a positive effect during assembly of printed-circuit board 1, since insertion of components 4, 5 and 6 is facilitated. It is also shown in FIG. 2 that the components have a substantially cylindrically symmetrical shape with substantially cylindrically symmetrical surface electrodes 11.

Printed-circuit board 1 assembled according to FIG. 2 can now be forwarded to a reflow soldering process, in order to establish a permanent connection of components 4, 5 and 6 to printed-circuit board 1, and during the movements occurring therewith of printed-circuit board 1, a displacement of components 4, 5 and 6 is avoided.

The grooves 2 and slotted contours 3 provided in printed-circuit board 1 additionally increase the strength of the connection established by the soldering process. The strength is increased due to the forming of the respective contours on the circuit board in consideration of the outside contours of the respectively used component. Also the selected shape has a positive effect with regard to the finally achieved strength of the connection.

FIG. 3 shows a module wherein housing 13 is placed on a base plate configured as a printed-circuit board 1 and already provided with various electronic components, such as a voltage surge arrester 4, varistor 5 and PCT's 6. Dome-type extensions 14 pass through cutouts 15, 16 or 17 provided in the circuit board so that cutouts 15, 16 and 17 are at least partly filled up with extension material. In the example shown in FIG. 3, dome-type extensions 14 extend past printed-circuit board 1 and its bottom side 18. In some cases it is however not necessary to dimension ex-tensions 14 so large, so that they can also be smaller.

In a preferred embodiment extensions 14 provided at housing 13 are cylindrical or polygonal, as shown in FIG. 4, and have at their front face a depression or notch 19 suitable to hold a not shown pin during a hot-pressing procedure. During heating and simultaneous pressure on extension 14, the extension material flows to a desired shape and prevents removal.

From FIG. 5 possible shapes can be seen for the cutouts to be provided in the printed-circuit board 1. In FIG. 5, the left most representation shows a blind hole 15. The two representations of cutouts in the center of FIG. 5 are depressions 16 with widths decreasing towards top side 20 of printed-circuit board 1. In the right most representation a borehole or a polygonal break-through portion 17 is provided.

The cutouts configured as blind holes 15 or depressions 16 have the advantage over the third possible cutout 17, in that the finally accomplished connection has a higher positive-linkage fraction, and is therefore safer.

However if cutouts are configured as boreholes or breakthrough portions 17 having a rectangular cross section, the accomplished connection forces are lower, but a disconnection possibly required later can be achieved in this variant considerably simpler and without destruction.

Figure 7:
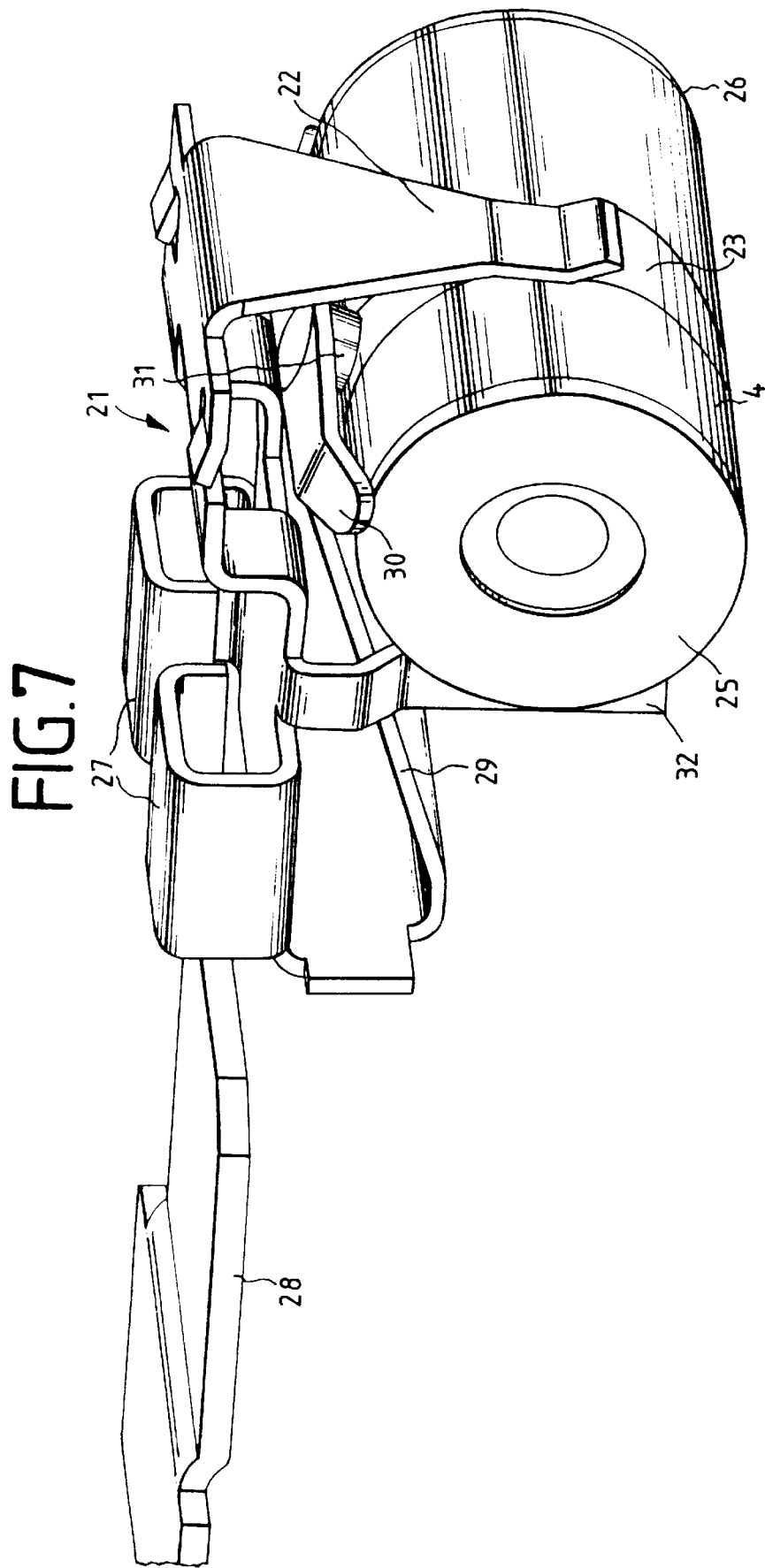
FIG. 7 is the contact element of FIG. 6 mounted on a voltage surge arrester.

The contact element 21 shown in FIG. 6 comprises a resilient first contact bracket 22 that is angled towards a central electrode 23 of a voltage surge arrester 4 shown in FIG. 7. Contact bracket 22 contacts central electrode 23. Central electrode 23 during an overvoltage is connected within the voltage surge arrester 4 to external electrodes 25 and 26 thereof External electrodes 25 and 26 in turn are connected in the inserted condition of the protection plug to one telecommunication wire each. Contact element 21 comprises a receiving portion formed by two bent-off resilient lugs 27. Into the receiving portion is inserted a contact lug 28 connected to a earthen or grounding bar. Thus, in case of an overvoltage, an earth or ground connection is established from the telecommunication wires a or b, resp., over external electrodes 25 or 26, resp., voltage surge arrester 4, central electrode 23, contact bracket 22 and lugs 27 of contact element 21 and contact lug 28 to the earthen bar.

One-piece contact element 21 comprises further a second resilient contact bracket 29 being transformed at its free end into a transverse web 30. The two ends of transverse web 30 are opposite to external electrodes 25 or 26, resp., of voltage surge arrester 4. Between the ends of transverse web 30 is attached a solder element 31 on the side of contact bracket 29 directed towards voltage surge arrester 4. The solder element rests under the spring force of contact bracket 29 against the insulating outer surface or central electrode 23 of voltage surge arrester 4 and thereby holds the ends of transverse web 30 spaced from the external electrodes 25 or 26, resp. When voltage surge arrester 4 is excessively heated up, for example when an increased voltage exists for a long time between the telecommunication wires a, b, but without leading to a response of voltage surge arrester 4, solder element 31 will melt. The solder element 31 no longer spaces the web from the voltage surge arrester 31 and the transverse web 30 comes by a spring force of the contact bracket 29 to rest against external electrodes 25 and 26 of voltage surge arrester 4. This causes an earth connection between electrodes 25 and 26, and the earthen bar to exist over contact element 21 with transverse web 30, contact bracket 29 and lugs 27 and contact lug 28.

In FIG. 6 are further disposed two holding legs 32 of contact element 21. Holding legs 32 are positioned with respect to contact bracket 22 on the other side of voltage surge arrester 4 so that they serve as a counter-bearing and prevent an unbalanced load of the solder connection between the voltage surge arrester 4 and the printed-circuit board carrying the latter.

In FIG. 7 is shown the contact element of FIG. 6 mounted on the voltage surge arrester 4, and it can further be seen that holding legs 32 rest against the insulated outer surface of voltage surge arrester 4 on both sides of central electrode 23.

In FIG. 8 is shown the protection plug in an inserted state with several electronic components, such as PCT'S, and a voltage surge arrester 4 being mounted on a printed-circuit board 1 within a housing 13. Contact element 21 is herein mounted on voltage surge arrester 4, as in the representation of FIG. 7. Simultaneously it is held by housing 13.

In FIG. 9 is shown another embodiment of a contact element 21. Second contact bracket 9 is opposite to first contact bracket 22, and solder element 31 is adapted to the external periphery of voltage surge arrester 4 such that the solder element is the counter-bearing for contact bracket 22, and holding legs 32 are therefore not required. Solder element 31 has an inner rest surface 33 in the form of an arc section, the radius of which is identical to the radius of cylindrical voltage surge arrester 4. In the central section of transverse web 30 is provided a cutout into which solder element 31 can be inserted and snap-fitted.

While specific embodiments of the invention have been shown and described in detail to illustrate the application of the principles of the invention, it will be understood that the invention may be embodied otherwise without departing from such principles.

LEGEND

| | |
|---|---|
| 1 | printed-circuit board |
| 2 | transverse groove |
| 3 | slotted contour |
| 4 | voltage surge arrester |
| 5 | varistors |
| 6 | PTC*'s |
| 7 | termination surfaces |
| 8 | borders |
| 9 | inner faces |
| 10 | bottom side |
| 11 | surface |
| 12 | surface |
| 13 | housing |
| 14 | extensions |
| 15, 16, 17 | printed-circuit board |
| 18 | bottom side |
| 19 | notch |
| 20 | top side |
| 21 | contact element |
| 22 | contact bracket |
| 23 | central electrode |
| 25, 26 | external electrodes |
| 27 | lugs |
| 28 | contact lug |
| 29 | contact bracket |
| 30 | transverse web |
| 31 | thermal element |
| 32 | holding leg |
| 33 | inner rest surface |

What is claimed is:

1. A circuit board comprising:

a plurality of electrical components;

board material including a surface, said board material defining depression sections for receiving said electrical components, said depression sections being shaped to conform to outside contours of said electrical components and securely hold said electrical components during a reflow solder operation;

reflow solder connections connecting said electrical components to said board material;

cutouts defined by said board material;

a housing for covering said board material, said housing including dome-type extensions of a partly deformable material in a direction of said board material, said extensions engaging in said cutouts, and said extensions passing through said board material and being dimensioned so to conform to a shape and size of cutouts to cause one of a positive linkage and frictional connection between said housing and said board material, said connection being established by deformation of said extensions by exposure to energy and/or force, such that said dome-type extensions do not project past another surface of said board material when said housing is connected to said board material.

2. A circuit board according to claim 1, wherein:

said cutouts are configured as blind holes.

3. A circuit board according to claim 1, wherein:

said cutouts are recesses having a width narrowing from said another surface to said surface.

4. A circuit board according to claim 1, wherein:

said cutouts are configured as one of uniform boreholes over a width of said board material, and as breakthrough portions having a polygonal cross-section.

5. A circuit board according to claim 1, wherein;

said extensions are made of a thermoplastic material.

6. A circuit board according to claim 1, wherein:

said extensions have a front face directed towards said another surface of said board, said front face defining one of a recess and notch.

7. A circuit board comprising:

a plurality of electrical components;

board material including a surface, said board material defining depression sections for receiving said electrical components, said depression sections being shaped to conform to outside contours of said electrical components and securely hold said electrical components during a reflow solder operation;

reflow solder connections connecting said electrical components to said board material;

a pluggable plastic material housing connected to said board material;

a voltage surge arrester included in said electrical components, said surge arrester includes two external electrodes each connectable to a telecommunication wire, said surge arrester also includes a central electrode connectable to a grounding bar;

thermal overload protection means for said surge arrester and for connecting said external terminals of said surge arrester to the grounding bar during excessive heating of said voltage surge arrester, said thermal overload protection means including a one-piece contact element inserted into said housing, said contact element including a first contact bracket in contact with said central electrode of said voltage surge arrester, said contact element including a receiving portion for a contact lug rigidly connected to the grounding bar, said contact element including a resilient second contact bracket biased against said surge arrester, said contact element including a thermal element positioned to space said second contact bracket from said external electrodes during normal operation and causing said second contact bracket to contact said external electrodes during excessive heating by a change in a shape of said thermal element.

8. A circuit board according to claim 7, wherein:

said second contact bracket includes a free end with a transverse web, ends of said web being contactable with said external electrodes;

said thermal element being positioned between said ends of said web.

9. A circuit board according to claim 7 wherein:

said thermal element is one of a molded part melting when heated, a bi-metal, a material becoming soft when heated, and memory alloy.

10. A circuit board according to claim 7, wherein;

said thermal element is rigidly connected to said second contact bracket.

11. A circuit board according to claim 7, wherein;

said thermal element is snap-fitted to said second contact bracket.

12. A circuit board according to claim 7, wherein:

said contact element includes a holding leg positioned at a side of voltage surge arrester opposite to first holding bracket, said holding leg resiliently resting against an insulating surface of said surge arrester.

* * * * *